US006456080B1

(12) United States Patent
Kim et al.

(10) Patent No.: US 6,456,080 B1
(45) Date of Patent: Sep. 24, 2002

(54) CATHODE RAY TUBE

(75) Inventors: Sang-kyun Kim, Incheon; Sang-mook Kim; Duk-sung Park, both of Suwon; Bong-wook Jung, Seoul, all of (KR)

(73) Assignee: Samsung SDI Co., Ltd., Kyungki-Do (KR)

( * ) Notice: Subject to any disclaimer, the term of this patent is extended or adjusted under 35 U.S.C. 154(b) by 0 days.

(21) Appl. No.: 09/642,931

(22) Filed: Aug. 22, 2000

(30) Foreign Application Priority Data

Aug. 24, 1999 (KR) .......................................... 99-35188

(51) Int. Cl.$^7$ .......................... G01R 31/24; G09G 1/04
(52) U.S. Cl. ...................................... 324/404; 315/382
(58) Field of Search ............................... 313/409, 414, 313/449; 315/382, 368.25, 368.28; 324/404, 164

(56) References Cited

U.S. PATENT DOCUMENTS 4,728,858 A * 3/1988 Koshigoes et al. ........... 315/15
5,990,637 A * 11/1999 Cho .......................... 315/382

FOREIGN PATENT DOCUMENTS

JP 55146847 * 11/1980 ................ 313/449

* cited by examiner

*Primary Examiner*—N. Le
*Assistant Examiner*—Vincent Q. Nguyen
(74) *Attorney, Agent, or Firm*—Lowe Hauptman Gilman & Berner, LLP

(57) ABSTRACT

A cathode ray tube including a bulb having a screen on which a fluorescent film is formed, and a funnel portion having a neck portion on the side opposite to the screen, an electron gun mounted in the neck portion of the bulb, a deflection yoke mounted on the bulb, for deflecting an electron beam emitted from an electron gun, a velocity modulator installed around the neck portion, and an eddy current generation preventing means installed on an electrode of the electrode gun, which corresponds to the velocity modulator, for preventing generation of an eddy current by the velocity modulator. Here, the electron gun has a cathode forming a triode portion, a control electrode, a screen electrode, a plurality of focusing electrodes sequentially aligned from the screen electrode, and a final accelerating electrode which is installed adjacent to a focusing electrode the farthest away from the cathode or protects a predetermined width of the outer circumferential surface of the focusing electrode.

14 Claims, 5 Drawing Sheets

CATHODE RAY TUBE

BACKGROUND OF THE INVENTION

1. Field of the Invention

The present invention relates to cathode ray tubes, and more particularly, to a cathode ray tube (CRT) having an improved electron gun installed at the neck portion of the CRT, for exciting a fluorescent film.

2. Description of the Related Art

There are various types of CRTs depending on functional characteristics such as projectors, oscilloscopes, monitors, TVs or the like. An example of these CRTs is shown in FIG. 1.

As shown in FIG. 1, a cathode ray tube includes a panel 12 on which a fluorescent film 11 is formed, and a funnel 15, sealed to the panel 12, having a neck portion 13 in which an electron gun 20 is mounted. A deflection yoke 16 for deflecting an electron beam emitted from the electron gun 20 is installed on the cone portion of the neck portion 13. Also, a velocity modulator (VM) 17 to which a differentiation value of an image signal is applied is installed on the outer circumferential surface of the neck portion 13 to control the velocity of deflection of an electron beam by the deflection yoke 16. In this CRT, a shadow mask frame assembly 18 is installed within the panel. However, this is not necessary in the case of monochrome CRTs used in projectors, oscilloscopes, or the like. The panel 12 and the funnel 15 can be formed in a body.

There are a variety of electron guns, each installed in a neck portion, depending on the type of CRTs for forming monochrome images or color images, the arrangement of electrodes constituting an electron gun, and the state of a voltage applied to each of the electrodes. An example of these electron guns is shown in FIG. 2.

The electron gun of FIG. 2 is disclosed in U.S. Pat. No. 4,904,898, which includes a cathode 21 for emitting thermoelectrons, a control electrode 22, a screen electrode 23, upper and lower focusing electrodes 24 and 25 sequentially installed adjacent to the screen electrode 23, and a final accelerating electrode 26 surrounding the end of the upper focusing electrode 25. Embedding portions (not shown) are formed on both sides of each of the cathode 12 and the aforementioned electrodes forming the electron gun 20, and fixed by a pair of bead glasses 27.

In the CRT having this electron gun 20, a beam of electrons emitted from the cathode of the electron gun is focused and accelerated while passing through an electron lense formed between the electrodes forming the electron gun. The focused and accelerated electron beam is selectively deflected by a deflection yoke according to positions of a fluorescent film scanned, and then excites the fluorescent film. During this process, in order to more clearly show the difference between a bright area and a dark area of an image formed by excitation of the fluorescent film, a two-pole coil of the VM 17 is provided with a current which is proportional to the secondary differentiation value of each image signal, and accordingly the deflection rate of an electron beam deflected by the deflection yoke 16 at a bright area of an image and a deflection rate at a dark area thereof is adjusted, whereby the contrast of an image is improved. This method is achieved by controlling an instantaneous scanning speed of an electron beam using the two-pole coil of the VM 17 installed in the same direction as the direction of the horizontal deflection magnetic field of the deflection yoke 16.

However, the focusing electrode of the electron gun installed at a position corresponding to a position where the VM 17 is installed has a cylindrical shape, such that the electrode generates an eddy current due to a high frequency current generated by the VM 17. This eddy current causes an inverse magnetic field because of a magnetic field generated by a coil, which deteriorates the deflection sensitivity of an electron beam against the current of the VM 17. Consequently, the deterioration in the deflection of an electron beam degrades the contrast of an image.

SUMMARY OF THE INVENTION

To solve the above problem, an objective of the present invention is to provide a cathode ray tube which can prevent a deflection sensitivity from being deteriorated due to an eddy current generated because of a velocity modulator Another objective of the present invention is to provide a cathode ray tube which can prevent a deterioration in the contrast of an image.

To achieve the above objectives, the present invention provides a cathode ray tube including: a bulb having a screen on which a fluorescent film is formed, and a funnel portion having a neck portion on the side opposite to the screen; an electron gun mounted in the neck portion of the bulb, the electron gun having a cathode forming a triode portion, a control electrode, a screen electrode, a plurality of focusing electrodes sequentially aligned from the screen electrode, and a final accelerating electrode which is installed adjacent to a focusing electrode the farthest away from the cathode or protects a predetermined width of the circumferential surface of the focusing electrode; a deflection yoke mounted on the bulb, for deflecting an electron beam emitted from an electron gun; a velocity modulator installed around the neck portion; and an eddy current generation preventing means installed on an electrode of the electrode gun, which corresponds to the velocity modulator, for preventing generation of an eddy current by the velocity modulator.

In the cathode ray tube, the eddy current generation preventing means has a plurality of slots formed along the outer circumferential surface of an electrode, which is opposite to the velocity modulator, in the lengthwise direction or in the circumferential direction.

Also, the eddy current generation preventing means is an electrode that is opposite to the velocity modulator, the focusing electrode formed by coaxially adjoining a plurality of rings to each other using an insulating material or a resistive material.

BRIEF DESCRIPTION OF THE DRAWINGS

The above objective and advantage of the present invention will become more apparent by describing in detail preferred embodiments thereof with reference to the attached drawings in which.

DESCRIPTION OF THE PREFERRED EMBODIMENTS

Figure 1:
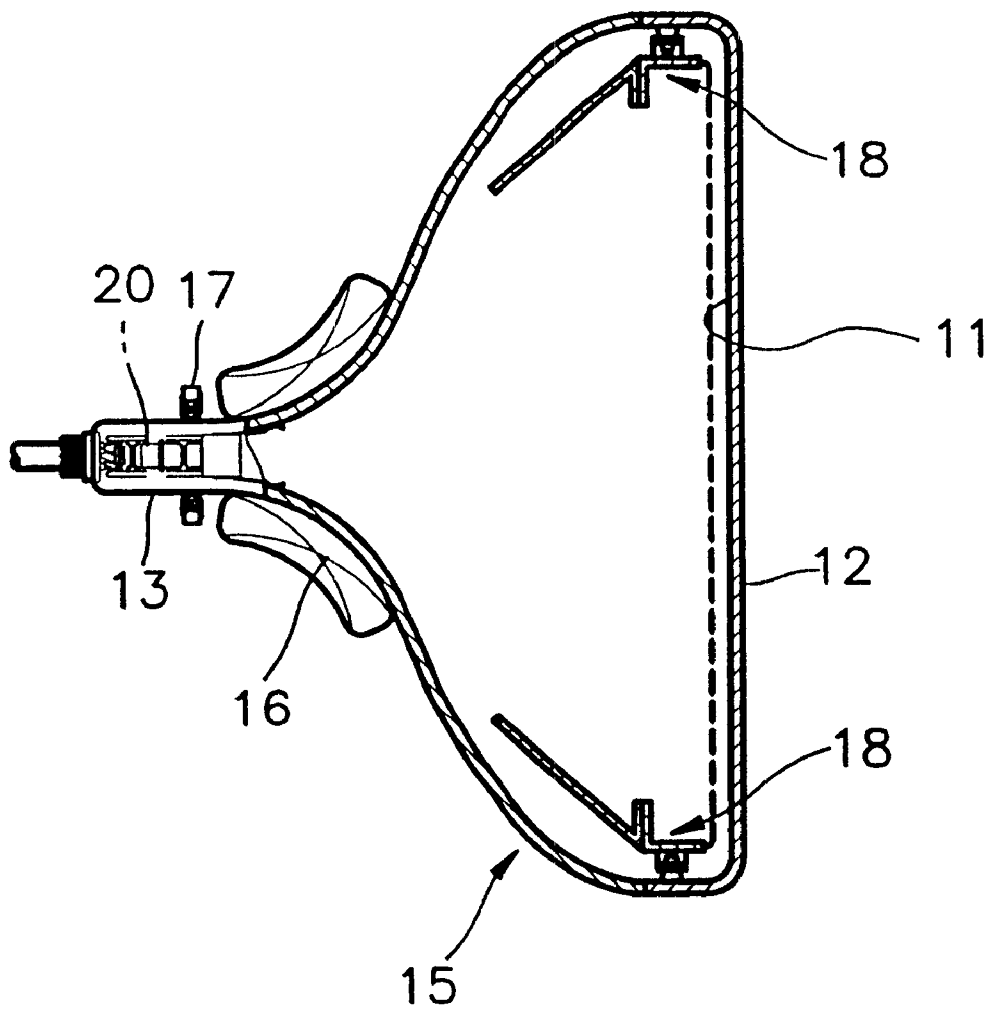
FIG. 1 (PRIOR ART)
FIG. 1 is a cross-sectional view of a typical cathode ray tube.
Figure 2:
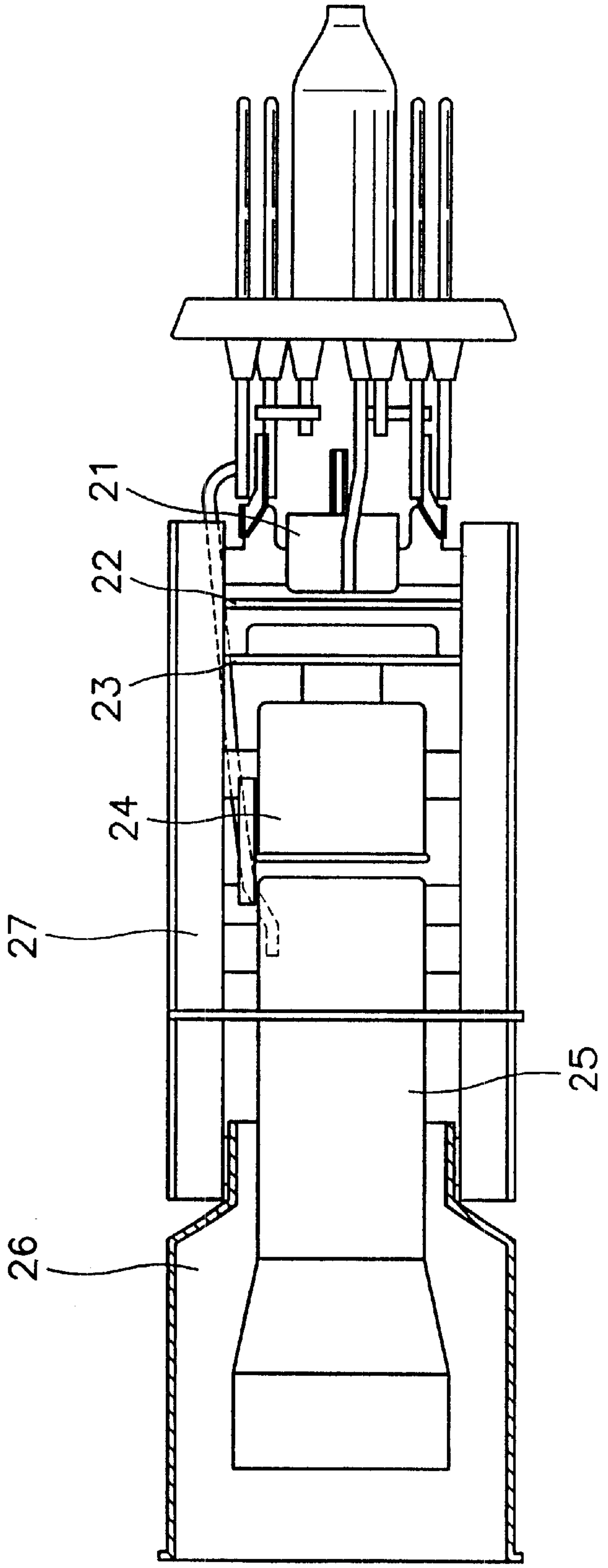
FIG. 2 (PRIOR ART)
FIG. 2 is a side elevation view of a conventional electron gun.
Figure 3:
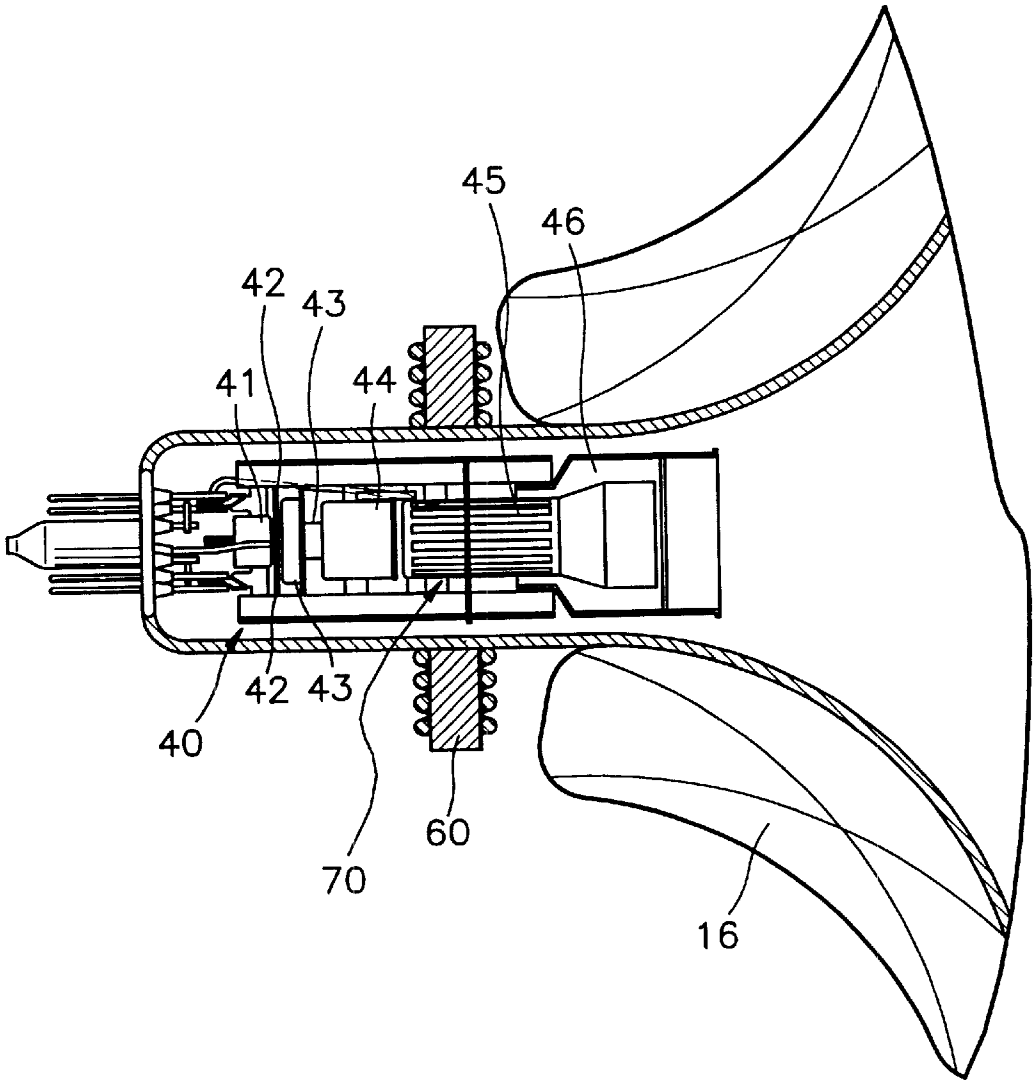
FIG. 3 is a side elevation view of part of a cathode ray tube according to the present invention.

In embodiment of a cathode ray tube according to the present invention shown in FIG. 3, an electron gun 40 is mounted in the neck of the cathode ray tube, and a deflection yoke 16 is installed on the funnel. Installed on the outer circumferential surface of the neck portion is a velocity modulation (VM) coil 60 to precisely show a dark area and a bright area of an image by controlling the deflection rate of an electron beam emitted from the electron gun 40.

As shown in FIG. 3, the electron gun 40 includes a cathode assembly 41 forming a triode portion, a control electrode 42, a screen electrode 43, first and second focusing electrodes 44 and 45 sequentially installed next to the screen electrode 43, and a final accelerating electrode 46. The final accelerating electrode 46 may be installed adjacent to the second focusing electrode 45 which is the farthest away from the cathode assembly 41, or has an aperture to protect the second focusing electrode 45 while being separated a predetermined distance from the outer circumferential surface of the second focusing electrode, whereby to form a main lense. The second focusing electrode 45, which corresponds to the VM coil 60, among the electrodes forming the electron gun, is provided with an eddy current generation preventing means 70 for preventing the generation of an eddy current by the VM coil 60.

Figure 4:
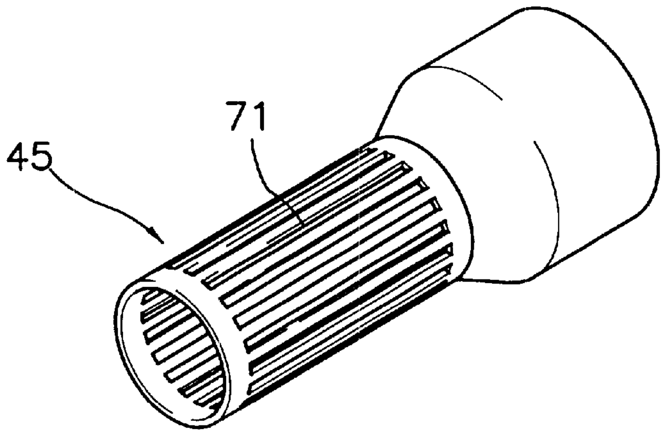
FIGS. 4 through 7 are perspective views of other embodiments of an electrode, which is opposite to a velocity modulator, according to the present invention.
Figure 5:
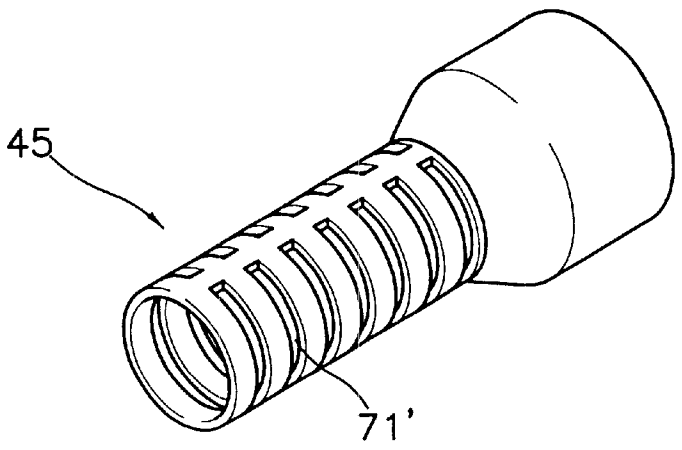

As shown in FIG. 4, the eddy current generation preventing means 70 can be formed by a plurality of slots 71 formed in the second cylindrical focusing electrode 45 in its lengthwise direction. Preferably, each of the slots 71 has a length that can be extended near both ends of the focusing electrode. Alternatively, as shown in FIG. 5, a plurality of slots 71' are formed along the outer circumferential surface of the second focusing electrode 45 in a direction perpendicular to the lengthwise direction, the slots being isolated from each other by a predetermined interval.

In the above-described embodiment, the eddy current generation preventing means 70 can be manufactured by forming slots in an electrode plate in the lengthwise direction or in a direction perpendicular to the lengthwise direction and then bending the resultant structure into a predetermined shape, for example, in a cylindrical shape.

Figure 6:
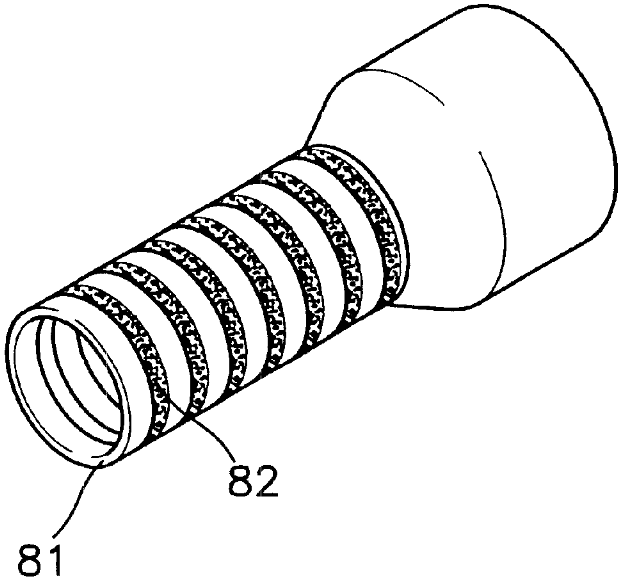

In another embodiment of the eddy current generation preventing means, as shown in FIG. 6, an eddy current generation preventing effect can be achieved by manufacturing a second focusing electrode prevented from generation of an eddy current, instead of installing an eddy current generation preventing means.

Figure 7:
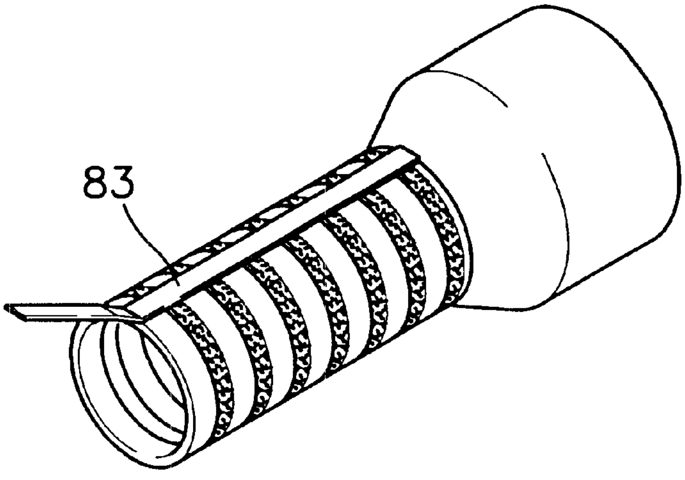

Referring to FIG. 6, the second focusing electrode consists of a plurality of rings 81 each having a predetermined width, and adjoining elements 82 interposed between adjacent rings to adjoin the rings 81 at predetermined intervals. The rings 81 are made of conductive metal, and the adjoining elements 82 are resistive elements or insulating elements. Each of the resistive elements may increase or decrease in its resistance as it becomes far away from one side of a ring 81. In the case when the adjoining elements 82 are formed of an insulating material, the rings 81 are connected to each other by a connector 83 for applying a predetermined voltage to the rings. The rings 81 can be simultaneously connected to each other by the single connector as shown in FIG. 7, or individual connectors may be provided to the rings to connect them. The rings 81 and the adjoining elements 82 can be manufactured by a molding method of forming a predetermined material and sintering powders.

In this cathode ray tube having such a configuration, an electron beam emitted from an electron gun is deflected by the deflection yoke 16 and then lands on a fluorescent film, whereby to form an image. During this process, in order to clarify the difference between a dark area and a bright area of an image, a voltage for delaying deflection of the electron beam is applied to the VM 60. This applied voltage causes alternate polarity and magnetic field to be formed in the VM coil 60. Also, a plurality of blades are formed in the lengthwise direction or circumferential direction of the second focusing electrode 45 for a metal electron gun, which corresponds to the VM coil 17, such that generation of an eddy current is prevented. That is, the second focusing electrode 45 has a plurality of slots 71 or 71', such that an eddy current is blocked due to a failure in forming a closed curve. Therefore, generation of heat and current loss due to generation of an eddy current in the second focusing electrode is reduced, and the sensitivity of the VM 60 can be improved.

Also, in the case that the second focusing electrode consists of a plurality of rings 81 and a plurality of adjoining elements 82 as shown in FIG. 8, a predetermined current is applied to each of the rings, whereby to form a plurality of electron lenses having a low magnification. In particular, in the case that the adjoining elements 82 are formed of a resistive material, a different amount of voltage are provided to each of the rings 81, whereby to form a plurality of lenses each having a different magnification.

In a cathode ray tube according to the present invention as described above, an eddy current can be prevented from being generated in an electrode corresponding to a VM, and consequent deteriorations in VM performance and image resolution can be prevented.

Although the invention has been described with reference to a particular embodiment, it will be apparent to one of ordinary skill in the art that modifications of the described embodiment may be made without departing from the spirit and scope of the invention.

What is claimed is:

1. A cathode ray tube, comprising:

a bulb having a screen on which a fluorescent film is coated, a funnel and a neck portion, the screen and the neck portion being formed on opposite sides of the funnel;

an electron gun mounted in the neck portion of the bulb, the electron gun comprising, sequentially in a longitudinal direction of the electron gun towards the screen:

a cathode, a control electrode, and a screen electrode for generating and propagating an electron beam in the longitudinal direction of the electron gun, a plurality of focusing electrodes for focusing the electron beam on predetermined pixels of the screen, and a final accelerating electrode for accelerating the focused electron beams towards the screen;

a deflection yoke mounted on the bulb, for deflecting the electron beam emitted from the electron gun; and a velocity modulator installed around the neck portion of the bulb in a region corresponding to the focusing electrode that is farthest from the cathode;

wherein the farthest focusing electrode is provided with an eddy current generation preventing arrangement for reducing generation of an eddy current induced by the velocity modulator in the farthest focusing electrode.

2. The cathode ray tube of claim 1, wherein the final accelerating electrode has a hollow end telescopically receiving therein at least a portion of the farthest focusing electrode.

3. The cathode ray tube of claim 1, wherein the eddy current generation preventing arrangement comprises a plurality of slots formed on a tubular body of the farthest focusing electrode and extending along said longitudinal direction.

4. The cathode ray tube of claim 3, wherein said slots are straight and spaced from each other in a circumferential direction of said tubular body of the farthest focusing electrode.

5. The cathode ray tube of claim 1, wherein the eddy current generation preventing arrangement comprises a plurality of slots formed on and extending circumferentially of a tubular body of the farthest focusing electrode.

6. The cathode ray tube of claim 5, wherein said slots are spaced from each other in said longitudinal direction and divide said tubular body of the farthest focusing electrode into multiple annular portions.

7. The cathode ray tube of claim 6, wherein said annular portions are physically and electrically connected by a connecting portion of said tubular body which extends in said longitudinal direction and defines ends of said slots.

8. The cathode ray tube of claim 6, wherein said annular portions are physically connected and electrically isolated by a plurality of insulative rings made of an insulating material that fills in said slots.

9. The cathode ray tube of claim 8, wherein each of said annular portions and insulative rings extends for full 360°.

10. The cathode ray tube of claim 9, wherein the electron gun further comprising a connector mounted on a circumferential surface of said tubular body to electrically connect said annular portions.

11. The cathode ray tube of claim 6, wherein said annular portions are physically connected by a plurality of resistive rings made of a resistive material that fills in said slots, each of said annular portions and resistive rings extends for full 360°.

12. The cathode ray tube of claim 11, wherein different voltages are applied to said annular portions to form a plurality of electron lenses.

13. The cathode ray tube of claim 11, wherein said resistive rings have different resistances.

14. The cathode ray tube of claim 13, wherein the resistances of said resistive rings increase along said longitudinally direction, from one end to an opposite end of said tubular body.

* * * * *